US006587243B1

(12) United States Patent
Zhou

(10) Patent No.: US 6,587,243 B1
(45) Date of Patent: Jul. 1, 2003

(54) SECOND ORDER PREDISTORTOR FOR A RETURN LASER TRANSMITTER

(75) Inventor: Shotung Zhou, Lansdale, PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/532,609

(22) Filed: Mar. 22, 2000

Related U.S. Application Data

(60) Provisional application No. 60/170,125, filed on Dec. 10, 1999.

(51) Int. Cl.[7] .............................................. H04B 10/04
(52) U.S. Cl. ........................ 359/180; 359/157; 359/161; 359/188
(58) Field of Search ................................ 359/157, 161, 359/180, 181, 182, 183, 184, 185, 186, 187, 188

(56) References Cited

U.S. PATENT DOCUMENTS

| | | | |
|---|---|---|---|
| 4,808,810 A | 2/1989 | Van Doorn | 250/214 |
| 4,882,482 A | 11/1989 | Smith et al. | 250/214 |
| 4,992,754 A | 2/1991 | Blauvelt et al. | 330/149 |
| 4,998,012 A | 3/1991 | Kruse | 250/214 |
| 5,161,044 A | 11/1992 | Nazarathy et al. | 359/157 |
| 5,172,068 A | 12/1992 | Childs | 328/162 |
| 5,321,710 A * | 6/1994 | Cornish et al. | 372/26 |
| 5,418,637 A | 5/1995 | Kuo | 359/161 |
| 5,424,680 A | 6/1995 | Nazarathy et al. | 330/149 |
| 5,455,705 A | 10/1995 | Gusinov | 359/189 |
| 5,481,389 A | 1/1996 | Pidgeon et al. | 359/161 |
| 5,523,716 A | 6/1996 | Grebliunas et al. | 330/149 |
| 5,568,087 A | 10/1996 | Gatti | 330/149 |
| 5,589,797 A * | 12/1996 | Gans | 330/149 |
| 5,600,472 A | 2/1997 | Uesaka | 359/161 |
| 5,606,286 A * | 2/1997 | Bains | 330/149 |
| 5,703,530 A | 12/1997 | Sato et al. | 330/149 |
| 5,752,174 A | 5/1998 | Matai et al. | 455/183.1 |
| 5,798,854 A | 8/1998 | Blauvelt et al. | 359/161 |
| 5,850,305 A * | 12/1998 | Pidgeon | 359/187 |
| 5,909,642 A | 6/1999 | Suzuki | 455/114 |
| 6,069,534 A | 5/2000 | Kobayashi | 330/308 |
| 6,107,877 A * | 8/2000 | Miguelez et al. | 330/66 |
| 6,122,085 A * | 9/2000 | Bitler | 359/180 |
| 6,204,718 B1 | 3/2001 | Pidgeon | 327/318 |

FOREIGN PATENT DOCUMENTS

| | | | |
|---|---|---|---|
| DE | 3024533 | 1/1982 | |
| DE | 3338024 | 5/1985 | |
| DE | 4212772 | 10/1993 | ............ H04H/1/00 |
| DE | 2656436 | 6/1998 | ............ H03F/1/32 |

(List continued on next page.)

OTHER PUBLICATIONS

Optical Receiver Front–End Nonlinear Distortion, Electronics Letters, Apr. 29, 1982, vol. 18, No. 9, pp. 361–362.
Bertelsmeier et al., Linearization of Broadband Optical Transmission Systems by Adaptive Predistortion, 1984, pp. 206–212.
Ha, Solid–State Microwave Amplifier Design, pp. 202–217.
Ohr, GaAs Finds Home in Wireless & High–Speed Data–Communications Applications, Computer Design, Mar. 1994, pp. 59–68.

(List continued on next page.)

Primary Examiner—Leslie Pascal
Assistant Examiner—Dzung Tran
(74) Attorney, Agent, or Firm—Volpe and Koenig, P.C.

(57) ABSTRACT

The invention provides a second order predistortion circuit which reduces distortions generated by an optical return laser transmitter. The predistortion circuit uses emitter follower as a second order distortion generator. Controlling the emitter D.C. current, the level of second order distortion signals can be easily controlled over a wide range.

This predistortion circuit can be confirmed with a digital control circuit for laser distortion compensation over temperature.

11 Claims, 2 Drawing Sheets

FOREIGN PATENT DOCUMENTS

| | | | |
|---|---|---|---|
| EP | 0498456 | 2/1992 | ............. H03F/1/32 |
| EP | 0552316 | 2/1992 | ........... H04B/10/18 |
| EP | 0620661 | 10/1994 | |
| GB | 1381597 | 1/1975 | |
| GB | 2164515 | 3/1986 | |
| WO | 9735390 | 9/1997 | |

OTHER PUBLICATIONS

Personick, Optical Fiber Transmission Systems Applications of Communciations Theory, pp. 62–75.

Eggers, 2GHz Bandwidth Predistortion Linearizer For Microwave Power Amplifiers At Ku–Band, pp. 1501–1505, Sep. 1994.

Eggers, Pamela—Linearized Solid State Power Amplifier At Ku–band Frequency, pp. 443–445, Sep. 1993.

Khilla et al., Semiconductor Transmitter Amplifiers And Travelling Wave Tube Linears For Future Communications Satellites, 8273 ANT Telecommunications Engineering Reports, No. 8, Feb. 1991 (including English translation).

Locatelli et al., Microwave Linear Power Amplifier With Micromodule Technology, pp. 1.3.1–1.3.6, Jun. 1987.

Kobayashi et al., A Novel Monolithic Linearized HEMT LNA Using HBT Tuneable Active Feedback, IEEE MTT–S International Microwave Symposium Digest, pp. 1217–1220, Jun. 1996.

* cited by examiner

SECOND ORDER PREDISTORTOR FOR A RETURN LASER TRANSMITTER

This patent application relates to U.S. provisional patent application Ser. No. 60/170,125 filed on Dec. 10, 1999 and entitled "SECOND ORDER PREDISTORTOR FOR A LASER TRANSMITTER".

BACKGROUND OF THE INVENTION

This invention is related to laser transmitters and more particularly to a second order predistortor for such return laser transmitters.

Optical transmitters are typically utilized in communication systems for receiving electrical signals and transforming them into optical signals. The electrical signals can be radio frequency (RF) signals being transmitted within the communication system. An example of such a communication system is a CATV network.

A CATV network typically consists of a downstream path extending from a service provider location known as a head end to various nodes through taps down to settop terminals located at subscriber locations. The upstream path extends from the settop terminals back to the head end. These communication systems can be designed to be partially optical and partially electrical. For example, communications between the headend and the nodes in both the upstream and downstream directions can be accomplished utilizing optical signals while communications in both directions between the nodes and settop boxes can be electrical. Such a system requires optical receivers and transmitters to be located both at nodes and at the headends.

Return optical transmitters are necessary at each node transmitting optical signals to the headend. Likewise, optical receivers are necessary at the headend to receive optical communications from the nodes traveling along the upstream path.

Since CATV systems are becoming increasingly bidirectional, bandwidth requirements along the upstream path are also increasing. The increased bandwidth requirements are attributable to the need for upstream communications associated with Internet access, fax capabilities, pay per view, and other upstream information transfer.

With the increasing bandwidth requirements comes a need to minimize second order distortion levels in the optical transmitters. Since the optical transmitters located at nodes are typically disposed along the network in outdoor environments, they are subject to large temperature variations. For example, ambient temperature may range from −40C. to +80C. These temperature variations effect laser transmitter performance and cause variation of second order distortion levels which may be between −40 dBc and −60 dBc being introduced by the lasers within the optical transmitters at various temperatures. A predistortion solution for a return transmitter, therefore, must have a controllable predistortion level mechanism that can be adjusted according to temperature changes.

SUMMARY

The invention addresses the above mentioned problem by providing a method and circuit for reducing distortion levels in an optical return transmitter. An RF input to the optical transmitter is first entered at an input stage. An emitter follower stage is connected to the input stage to introduce a desired level of second order predistortion in the RF signal. The desired predistortion level is controlled by controlling the level of a D.C. current applied to the emitter follower stage.

BRIEF DESCRIPTION OF THE DRAWINGS

The invention will now be described by way of example with reference to the accompanying figures of which.

DETAILED DESCRIPTION OF THE PREFERRED EMBODIMENT

Figure 1:
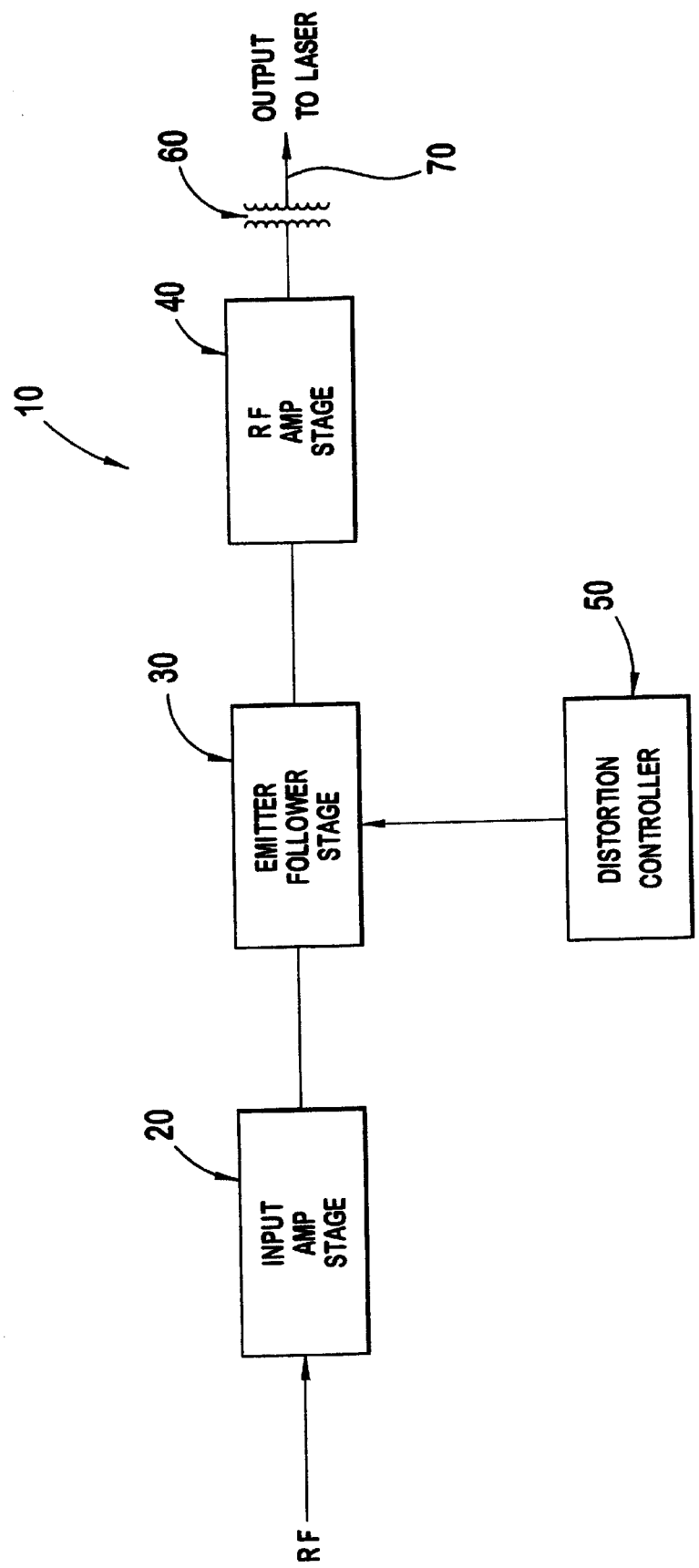
FIG. 1 is a block diagram of a predistortor for an optical transmitter according to the present invention.

The invention will first be described in general with reference to FIG. 1. A predistortor 10 is provided having an input stage 20 for receiving an electrical signal, an emitter follower stage 30 for introducing a second order predistortion, a distortion controller 50 for controlling the predistortion level, an RF amplifier stage 40 coupled to an optical source through a transformer 60. In CATV communication systems, the electrical signal is usually a broadband RF signal.

Figure 2:
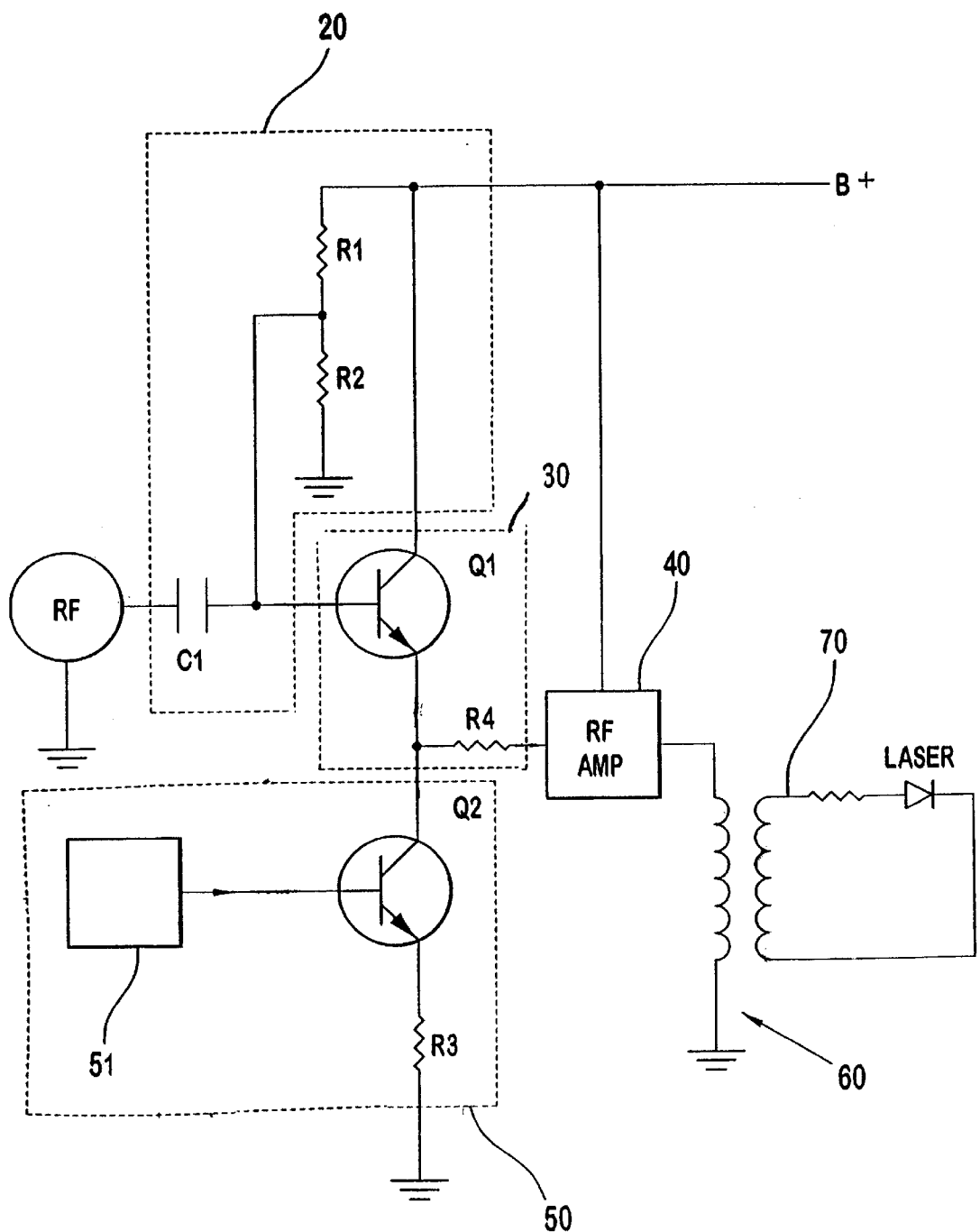
FIG. 2 is an exemplary schematic of an implementation of the block diagram of FIG. 1.

Each of the major components will now be described in greater detail with reference to FIG. 2. It should be understood that FIG. 2 shows a preferred circuit for achieving the block diagram of FIG. 1, however, other circuit arrangements for achieving the invention will be apparent to those skilled in the art. The input stage 20 consists of capacitor $C_1$, and resistors $R_1$, $R_2$. The emitter follower stage 30 consists of $Q_1$, and $R_4$. The RF signal is connected to the base of transistor $Q_1$ through capacitor $C_1$. The collector of transistor $Q_1$, is connected to the positive voltage supply B+ in a common collector or emitter follower configuration. The positive voltage supply B+ is also connected to ground through resistors $R_1$ and $R_2$. A voltage supply taken from a tap between resistors $R_1$ and $R_2$ is connected to the base of transistor $Q_1$ The output of the emitter follower stage 30 comes from the emitter of transistor $Q_1$ and $R_4$.

The distortion level controller 50 consists of transistor $Q_2$, resistor $R_3$ and the input D.C. voltage generator 51. The collector of transistor $Q_2$ is connected to the emitter of transistor $Q_1$. The emitter of transistor $Q_2$ is connected to ground through resistor $R_3$. The base of transistor $Q_2$ is controlled by the D.C. voltage generator 51 to control the second order distortion produced by the emitter follower stage 30.

It should be understood by those reasonably skilled in the art that the distortion controller 50 may be achieved in various ways. For example, a microprocessor and digital to analog converter may be utilized to control the D.C. voltage. The D.C. voltage may be a function of ambient temperature or other factors which may affect the second order distortion products produced by a laser. For example, a given laser device will have known operating characteristics at various temperatures. Predistortion may be introduced to correct distortion produced by the laser. The amount of predistortion is a function of the ambient temperature. The microprocessor may utilize a lookup table within the distortion controller 50 to determine the D.C. voltage necessary at a given temperature.

The RF amplifier stage 40 receives input through resistor $R_4$ which is connected between the emitter of transistor $Q_1$ and collector of transistor $Q_2$. Power is supplied to the RF amplifier stage 40 through the positive voltage supply B+. The output of the RF amplifier stage 40 is fed to transformer 60 which is connected to a laser. By reversing the output transformer connections, the sublinear or superlinear laser diode curves can be compensated.

Referring now to FIG. 2, operation of the predistortor 10 will be described in greater detail. The RF input supplied to the input amplifier stage 20 passes the RF signal to $Q_1$ at approximately unity gain. Based upon the ambient temperature, a D.C. voltage is supplied to the base of transistor $Q_2$ to generate a desired level of second order distortion which is then added to the output from transistor $Q_1$ emitter. This predistortor signal is supplied to the RF amplifier 40 through resistor $R_4$. The RF amplifier 40 serves to introduce gain into the predistorted signal which is then supplied to the laser through transformer 60. The predistortion RF signal generated by the emitter follower $Q_1$ will cancel the distortion signal produced by a laser. A low second order distortion optical signal which corresponds to the RF input signal can be obtained.

What is claimed is:

1. A method of reducing distortion levels in an optical return transmitter comprising:

receiving an electrical input signal into an input stage;

introducing a second order distortion signal to the electrical signal by use of an emitter follower stage; and, controlling the D.C. current of the emitter follower amplifier to introduce a desired level of second order distortion.

2. The method of claim 1 wherein control of the D.C. current is responsive to a change in a control input.

3. The method of claim 2 wherein the control input is a signal representative of ambient temperature.

4. A predistortion circuit for a laser transmitter comprising:

an input stage coupled to an electrical signal input;

an emitter follower stage coupled to an output of the input stage;

an amplifier stage coupled to an output of the emitter follower stage; and, a distortion controller coupled to a control input of the emitter follower stage whereby the distortion controller generates a signal to control the amount of second order distortion generated in the emitter follower stage.

5. The predistortion circuit of claim 4 wherein the input stage comprises a capacitance coupled to the electrical signal input.

6. The predistortion circuit of claim 5 wherein the emitter follower stage comprises a transistor having a base coupled to the capacitance, a collector coupled to a voltage source and an emitter coupled to both the distortion controller and the amplifier stage.

7. The predistortion circuit of claim 6 wherein the distortion controller comprises a transistor having a base coupled to a voltage generator and a collector coupled to the emitter of the emitter follower transistor.

8. The predistortion circuit of claim 7 wherein the voltage generator is controlled by a microprocessor.

9. The predistortion circuit of claim 8 wherein the microprocessor controls the voltage generator in response to a control input.

10. The predistortion circuit of claim 9 wherein the control input is a signal representative of ambient temperature.

11. The predistortion circuit of claim 8 wherein the microprocessor utilizes a look up table having voltage set points corresponding to ambient temperatures.

* * * * *

UNITED STATES PATENT AND TRADEMARK OFFICE
CERTIFICATE OF CORRECTION

PATENT NO. : 6,587,243 B1  Page 1 of 1
DATED : July 1, 2003
INVENTOR(S) : Shutong Zhou It is certified that error appears in the above-identified patent and that said Letters Patent is hereby corrected as shown below:

<u>Title page,</u>
Item [75], delete "Shotung Zhou", and insert therefor -- Shutong Zhou --.

Signed and Sealed this

Thirtieth Day of December, 2003

JAMES E. ROGAN
*Director of the United States Patent and Trademark Office*